United States Patent [19]

Shibutani

[11] Patent Number: 5,107,512
[45] Date of Patent: Apr. 21, 1992

[54] FREQUENCY STABILIZATION OF A LASER BEAM BY USING A BIREFRIGENT BODY

[75] Inventor: Makoto Shibutani, Tokyo, Japan

[73] Assignee: NEC Coproration, Tokyo, Japan

[21] Appl. No.: 575,719

[22] Filed: Aug. 31, 1990

[30] Foreign Application Priority Data

Aug. 31, 1989 [JP] Japan .................................. 1-226863

[51] Int. Cl.⁵ ............................................. H01S 3/10
[52] U.S. Cl. ........................................ 372/32; 372/27; 372/29; 372/105
[58] Field of Search ....................... 372/27, 29, 32, 34, 372/105, 46, 45, 50

[56] References Cited

U.S. PATENT DOCUMENTS

| | | | |
|---|---|---|---|
| 3,530,402 | 9/1970 | Doyle et al. | 372/105 X |
| 3,549,236 | 12/1970 | Mink | 372/105 X |
| 3,588,738 | 6/1971 | Goodwin | 372/32 |
| 4,071,751 | 1/1978 | Waksberg | 372/27 X |
| 4,451,923 | 5/1984 | Hansch et al. | 372/32 |
| 4,485,475 | 11/1984 | Large et al. | 372/32 |
| 4,547,664 | 10/1985 | Vogt et al. | 250/205 |

Primary Examiner—Georgia Epps
Attorney, Agent, or Firm—Sughrue, Mion, Zinn, Macpeak & Seas

[57] ABSTRACT

To supply a frequency control signal to a laser diode module for generating a laser beam susceptible to a variation in frequency or wavelength, a frequency stabilizing device comprises a birefringent body (21) for converting the variation to a variation in a polarization state of the laser beam to produce a polarization varied beam, which a polarization separating element (22) separates into first and second beam components having orthogonally polarized directions and first and second beam intensities. Optical detectors (26,27) detect the beam intensities to produce first and second detection signals. A subtracter (28) calculates a difference between the beam intensities. A control signal producing arangement (29) produces the frequency control signal in compliance with the difference. Preferably, the difference is normalized by a sum of the beam intensities. The birefringent body may be a uniaxial or a biaxial body. The uniaxial body should have an optic axis which forms an angle of 45° with a predetermined plane of polarization of the laser beam. In this event, the orthogonally polarized directions should be parallel and perpendicular to predetermined direction of polarization. It is possible to use the sum in stabilizing an output power of the laser diode module.

12 Claims, 4 Drawing Sheets

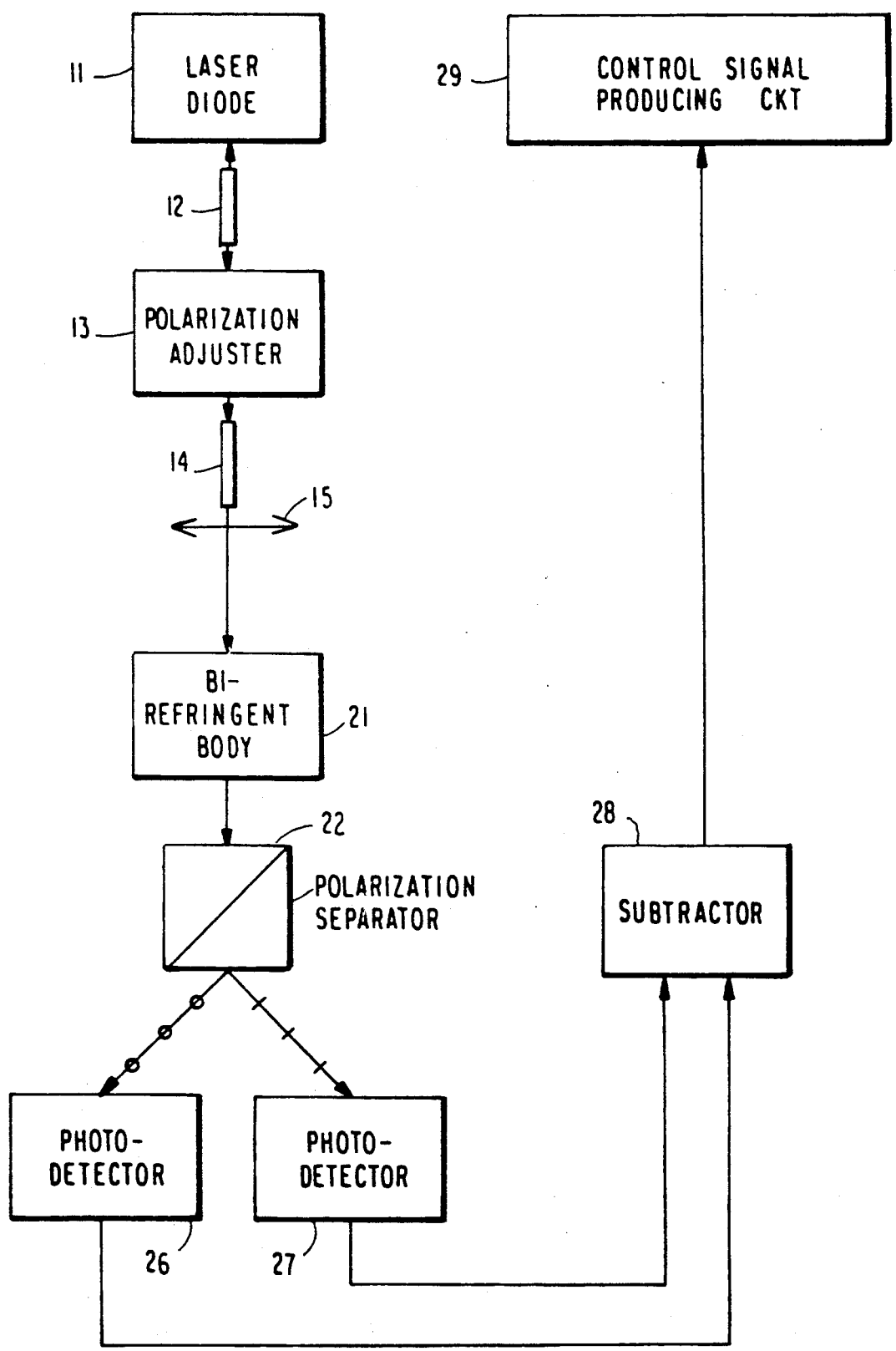

FREQUENCY STABILIZATION OF A LASER BEAM BY USING A BIREFRIGENT BODY

BACKGROUND OF THE INVENTION

This invention relates to a frequency stabilizing device for a laser diode module.

Laser diodes are used in optical communication, optical information processing, optical measurement, and various other applications of optics. For use in such a field of application, the laser diode is included in a module which is usually called a laser diode module and will later be exemplified. The laser diode module is therefore for generating a laser beam along an optical path. The laser beam has a frequency or wavelength which is inevitably subjected to a variation. Frequency stabilization of a laser beam is therefore urgently required.

On stabilizing the frequency of a laser beam, a frequency reference is used in detecting a frequency difference between the frequency of the laser beam and the frequency reference. An error signal is produced from the frequency difference for use in giving negative feedback to the laser diode module to control the temperature of the laser diode, an injection current supplied to the laser diode, or both.

In a conventional frequency stabilizing device for a laser diode module, a Fabry-Perot resonator is used as the frequency reference. An example of such conventional frequency stabilizing devices is described in a letter contributed by M. S. Nakamura and another to the Electronics Letters, Volume 26, No. 6 (Mar. 15, 1990), pages 405 and 406, under the title of "Frequency-Stabilised LD Module with a Z-Cut Quartz Fabry-Perot Resonator for Coherent Communication".

It has, however, been impossible by a frequency stabilizing device comprising the Fabry-Perot resonator by itself to get a zero-cross signal as the error signal. Generally speaking, the zero-cross signal should represent zero when a predetermined point is reached by a quantity to be controlled. The zero-cross signal should have a positive and a negative value when the quantity respectively has positive and negative errors relative to the predetermined point. Moreover, the laser beam is subjected to a considerable amount of reflection on entering the Fabry-Perot resonator. The conventional frequency stabilizing devices have therefore been complicated, bulky, expensive, and unreliable.

SUMMARY OF THE INVENTION

It is therefore an object of the present invention to provide a frequency stabilizing device for a laser diode module, which device has a simple structure.

It is another object of this invention to provide a frequency stabilizing device of the type described, which is compact, inexpensive, and reliable.

Other objects of this invention will become clear as the description proceeds.

On describing the gist of this invention, it is possible to understand that a frequency stabilizing device is which a laser diode module for generates a laser beam having a frequency susceptible to a variation and is for supplying a frequency control signal to the laser diode module to stabilize the frequency.

According to this invention, the above-understood frequency stabilizing device comprises: a birefringent body supplied with the laser beam for converting the variation to a variation in a polarization state of the laser beam to produce a polarization varied beam; a polarization separating element for separating the polarization varied beam into first and second beam components which are orthogonally polarized and have first and second beam intensities; a first optical detector supplied with the first beam component for detecting the first beam intensity to produce a first detection signal representative of the first beam intensity; a second optical detector supplied with the second beam component for detecting the second beam intensity to produce a second detection signal representative of the second beam intensity; a subtracter supplied with the first and the second detection signals for calculating a difference between the first and the second beam intensities to produce a difference signal representative of the difference; and a control signal producing arrangement supplied with the difference signal for producing the frequency control signal in compliance with the difference.

BRIEF DESCRIPTION OF THE DRAWING

FIG. 1 is a block diagram of a laser diode module and a frequency stabilizing device which is for the laser diode module and is according to a first embodiment of the instant invention;

DESCRIPTION OF THE PREFERRED EMBODIMENTS

Figures 2A, 2B, 2C, 2D, 2E:
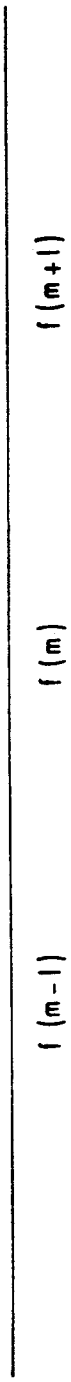
FIG. 2 is an illustration for use in describing operations of the frequency stabilizing device depicted in FIG. 1.

Referring to FIG. 1, attention will be directed to a frequency stabilizing device according to a first embodiment of the present invention. The frequency stabilizing device is for a laser diode module which comprises a laser diode 11 for generating a laser beam, a local optical fiber 12 for transmitting the laser beam, and a polarization adjuster 13 supplied with the laser beam through the local optical fiber 12 to produce a polarization adjusted beam in the manner which will presently be described. In the laser diode module, an additional optical fiber 14 is used to supply the polarization adjusted beam to a lens 15 for producing a substantially collimated beam along an optical path. The laser diode module is therefore for generating the laser beam as the substantially collimated beam.

The laser beam has a frequency or wavelength which is unavoidably subjected to a variation due to the temperature of the laser diode 11, an injection current supplied to the laser diode 11, or both. The laser beam therefore has an instantaneous frequency which may vary from time to time. The laser beam is generated with an output power or intensity which is subjected to a variation mainly due to the injection current.

The frequency stabilizing device is for supplying a frequency control signal to the laser diode 11 of the laser diode module to stabilize the instantaneous frequency at a predetermined frequency. Stabilization of the output power will be described when the description proceeds to a different embodiment of this invention.

It is known in the art that the laser diode 11 generates the laser beam as a linearly polarized beam having an original direction of polarization as its state of polarization. That is, the laser beam has an original plane of polarization when generated by the laser diode 11. More in detail, the laser diode 11 has an active layer (not shown) which has a pair of facets and in which laser oscillation takes place. The laser beam is emitted through each facet with the original plane of polarization parallel to the active layer.

The polarization adjuster 13 may comprise a half-wave plate and a quarter-wave plate in juxtaposition (not shown) and is for polarization adjusting the polarization state of the substantially collimated beam. It may be mentioned here that the polarization adjuster 13 adjusts the polarization state of the laser beam incident thereon to make the substantially collimated beam have a predetermined direction of polarization, namely, a predetermined plane of polarization.

The polarization adjuster 13 may alternatively comprise a polarization maintaining optical fiber. In this event, the polarization state of the substantially collimated beam is optionally adjusted by twisting the polarization maintaining optical fiber. Moreover, it is possible to substitute the polarization maintaining optical fiber for an assembly of the polarization adjuster 13 and the optical fibers 12 and 14.

In FIG. 1, the frequency stabilizing device comprises along the optical path a birefringent body 21 supplied with the substantially collimated beam from the lens 15 as an incident beam. In the manner which will become clear as the description proceeds, the birefringent body 21 produces a polarization varied beam by converting the variation in the frequency to a variation in the polarization state of the polarization varied beam. In general, the polarization varied beam is elliptically polarized depending on the instantaneous frequency.

A polarization separating element 22 is typically a polarization beam splitter and is for separating or splitting the polarization varied beam into first and second beam components which are orthogonally polarized. In more detail, the first and the second beam components are linearly polarized beams having orthogonal directions of polarization or orthogonal planes of polarization. The first beam component has a first beam intensity which depends on the polarization state of the polarization varied beam. Similarly, the second beam component has a second beam intensity.

A first optical detector or photodetector 26 is supplied with the first beam component and is for detecting the first beam intensity to produce a first detection signal representative of the first beam intensity. Supplied with the second beam component, a second optical detector 27 detects the second beam intensity and produces a second detection signal representative of the second beam intensity.

A subtracter 28 is supplied with the first and the second detection signals and is for calculating a difference between the first and the second beam intensities. The subtracter 28 thereby produces a difference signal which has a difference signal value representative of the difference.

A control signal producing circuit 29 serves as a control signal producing arrangement supplied with the difference signal from the subtracter 28 for producing the frequency control signal in compliance with the difference. In more detail, the frequency control signal has a control current value dependent on the difference. The frequency control signal is delivered to the laser diode 11 or to the laser diode module to stabilize the instantaneous frequency at the predetermined frequency.

In the example being illustrated, the control signal producing circuit 29 delivers a bias current to the laser diode 11 and gives negative feedback to the bias current. The control signal producing circuit 29 therefore comprises a bias current determining circuit (not shown) for producing a bias current determining current by using a variable resistor in voltage dividing a reference voltage produced by a reference voltage source comprising a Zener diode. In the control signal producing circuit 29, an operational amplifier (not shown) has a non-inverting input terminal supplied with the bias current determining current from the bias current determining circuit. An inverting input terminal is supplied with the difference signal from the subtracter 28. An amplifier output signal is produced from an output terminal of the operational amplifier and is used to drive a booster transistor (not shown) for the laser diode 11. This frequency control of the laser beam will later be described more in detail.

It will be presumed that the birefringent body 21 is a uniaxial crystal body 21 which is made of a uniaxial crystal having only one optic axis. In the manner known in general, the uniaxial crystal has different indices of refraction for ordinary and extraordinary rays travelling in the crystal. A typical example of the uniaxial crystal is Iceland spar which has a marked difference of 0.1720 between the indices of refraction for the sodium D line at 18° C. The uniaxial crystal body 21 is oriented so that the optic axis is perpendicular to the optical path of the substantially collimated beam.

For the time being, it will be assumed that the uniaxial crystal body 21 has a pair of end surfaces which are parallel to the optic axis. One of the end surface is an input end surface for receiving the incident beam. The other is an output end surface for producing the polarization varied beam. When made of Iceland spar, the uniaxial crystal body 21 may have a length selected between 1 and 5 cm and a cross-sectional area of about 0.5 cm square parallel to the optic axis. As called herein, the length is a spacing or distance between the input and the output end surfaces and is alternatively called a thickness.

The polarization separating element 22 is oriented so that each of the orthogonal directions of polarization of the first and the second beam components may form an angle of 45° with a plane which is parallel to the optic axis of the uniaxial crystal body 21 and the optical path of the polarization varied beam. In other words, the uniaxial crystal body 21 and the polarization separating element 22 are oriented so that the polarization separating element 22 may produce the first and the second beam components with a maximum beam intensity and a zero beam intensity, respectively, when the polarization varied beam is a linearly polarized beam.

The polarization adjuster 13 is now adjusted so that the predetermined direction of polarization of the substantially collimated beam or of the incident beam may form an angle of 45° with the optic axis of the uniaxial crystal body 21 on a plane which is perpendicular to the optical path. In other words, the substantially collimated beam is subjected to polarization adjustment so that the predetermined plane of polarization may form the angle of 45° with the optic axis. The orthogonal directions of polarization of the first and the second beam components are therefore one and the other of two directions which are parallel and perpendicular to the predetermined direction. Together with the uniaxial crystal body 21 and the polarization separating element 22, the predetermined direction or plane of polarization is correctly oriented when the first and the second beam components have a common maximum beam intensity in the manner which will become clear in the following.

Turning now to FIG. 2 and continuously referring to FIG. 1, the predetermined frequency will be called an m-th frequency and will be designated by f(m), where m represents an appreciably great positive integer which will presently become clear. It will be assumed that the instantaneous frequency of the laser beam varies continuously with time through an (m−1)-th frequency f(m−1), the m-th frequency f(m), and an (m+1)-th frequency f(m+1) which are indicated along a first or top line labelled (A) in FIG. 2.

In this event, the polarization varied beam has an instantaneous polarization state which is periodically variable in the manner schematically illustrated in FIG. 2 along a second line labelled (B). It may be mentioned here that the incident beam travels in the uniaxial body 21 as ordinary-ray and extraordinary-ray components having different speeds of propagation in the uniaxial body 21 and their respective planes of polarization which are parallel and perpendicular to the optic axis and are vertical and horizontal in FIG. 2.

Leftmost drawn in FIG. 2, a line segment exemplifies an instantaneous polarization state which may be called a first linear polarization state and can be understood to have a direction of polarization which is coincident with the predetermined direction of polarization and is had by the substantially collimated beam at the input end surface of the uniaxial crystal body 21. When the instantaneous frequency becomes higher, the first linear polarization state varies to a first elliptic polarization state, a first circular polarization state, a second elliptic polarization state, a second linear polarization state, a third elliptic polarization state, a second circular polarization state, a fourth elliptic polarization state, the first linear polarization state, and so forth.

It will be surmised that the first and the second beam components are produced by the polarization separating element 22 with the orthogonal directions of polarization which are coincident with the second and the first linear polarization states, respectively. Under the circumstances, the first and the second beam intensities are variable in the manner illustrated along third and fourth lines labelled (C) and (D) in FIG. 2. The difference current value sinusoidally varies in the manner illustrated along a fifth or bottom line labelled (E) in FIG. 2. In this manner, the difference signal is a zero-cross signal by itself and well serves as an error signal for use in stabilizing the instantaneous frequency at the predetermined frequency f(m).

A frequency range between the frequencies f(m−1) and f(m+1) is called a free spectral range in the art. It is possible to stabilize the instantaneous frequency at the predetermined frequency f(m) if the instantaneous frequency is somewhere within the free spectral range.

In connection with the uniaxial crystal body 21 having a difference D between the indices of refraction, the m-th frequency f(m) is given by an equation:

$$f(m) = mc/(DL),$$

where c represents the velocity of light in vacuum and L represents the length or the thickness of the uniaxial crystal body 21. It will be assumed that the instantaneous frequency should be stabilized so that the laser beam be generated at a predetermined wavelength of 1.5520 microns. The m-th frequency f(m) is equal to 193.17 THz. Let Iceland spar be used as the uniaxial crystal. Under the circumstances, the length of 1 cm gives the free spectral range of about 191 GHz with a value of 1011 used as the appreciably great positive integer m. In experiments, the free spectral range was about 155 GHz because the uniaxial crystal body 21 had an actual length of 1.1 cm and because of experimental errors. The length of 5 cm gives a narrower free spectral range of about 40 GHz. It is possible in this manner to optionally select the free spectral range.

In an example of the laser diode module, a distributed feedback laser diode (DFB LD) was used as the laser diode 11 to generate a laser beam of a wavelength of about 1.55 microns. In general, the distributed feedback laser diode generates the laser beam of a lower frequency when supplied with a stronger bias current. In the frequency stabilizing device for the laser diode module being exemplified, the control signal producing circuit 29 is made first to select a temporary value for the bias current. The temporary value is for making the instantaneous frequency fall within the free spectral range. The difference current value is superposed on the temporary value. When the instantaneous frequency is higher than the predetermined frequency, the difference signal of a negative value raises the bias current from the temporary value to make the instantaneous frequency decrease towards the predetermined frequency. When the instantaneous frequency is lower than the predetermined frequency, the difference signal of a positive value reduces the bias current from the temporary value to raise the instantaneous frequency towards the predetermined frequency. It was possible in this manner to restrict the variation in the instantaneous frequency within a controlled range which was the predetermined frequency plus and minus 40 MHz when the uniaxial crystal body 21 was made of Iceland spar to have a length of 5 cm.

Figure 3:
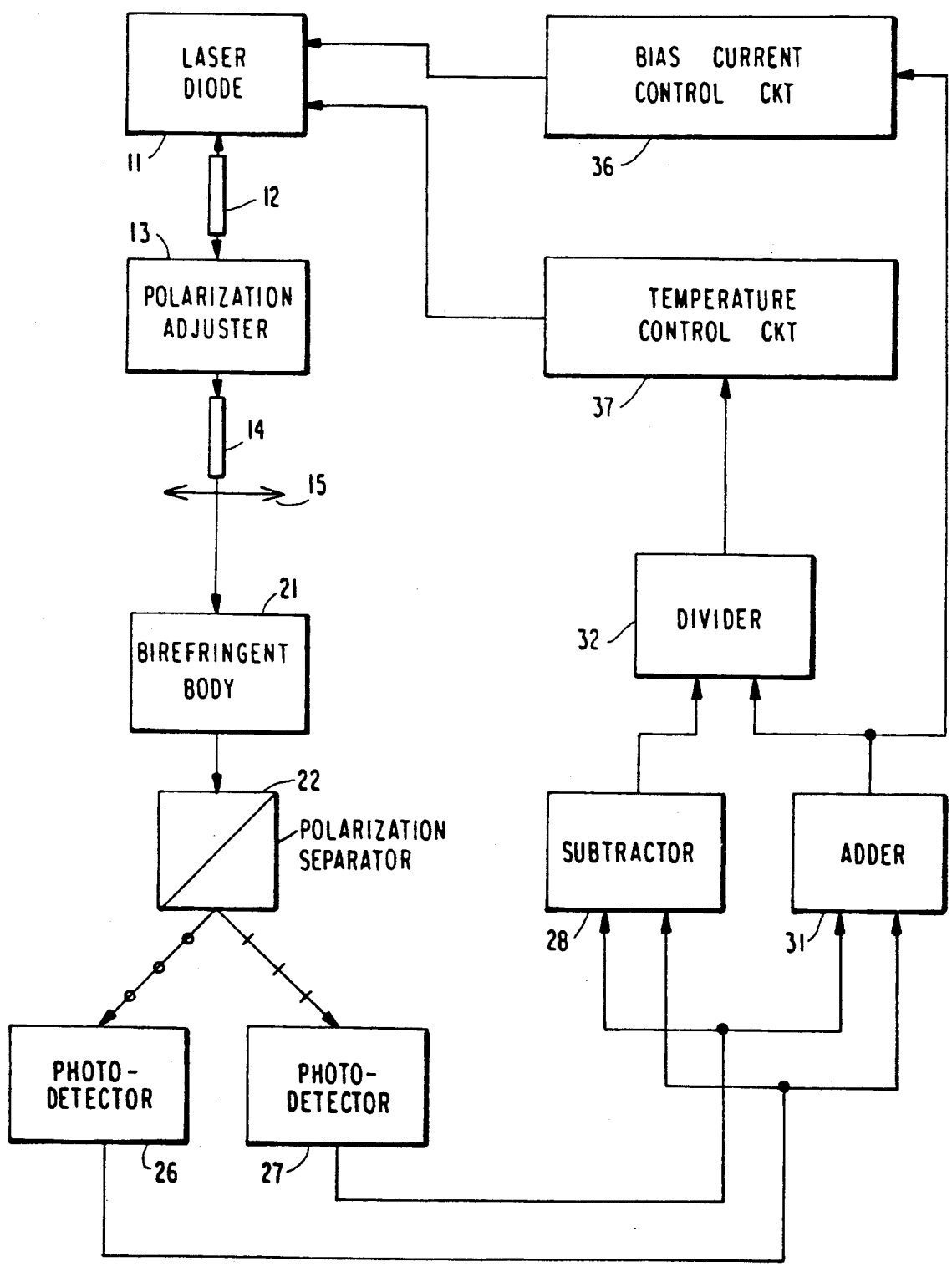
FIG. 3 is a block diagram of a laser diode module and a frequency stabilizing device which is for the laser diode module and is according to a second embodiment of this invention.

Referring to FIG. 3, the description will proceed to a frequency stabilizing device according to a second emobdiment of this invention. The frequency stabilizing device is for a laser diode module of the type described in conjunction with FIG. 1. Similar parts are designated by like reference numerals and are operable with likewise named optic and electric signals.

In FIG. 3, the first and the second detection signals are delivered to an adder 31 for calculating a sum of the first and the second beam intensities to produce a sum signal having a sum current value representative of the sum. The sum current value depends on the output power of the laser diode 11 independently of the instantaneous frequency and can be used as a power error signal in stabilizing the output power at an optimum value.

Supplied with the difference and the sum signals, a divider or quotient calculator 32 is for calculating a quotient which is equal to the difference divided by the sum. The divider 32 thereby produces a quotient signal having a quotient current value representative of the quotient. Inasmuch as the sum represents the output power, the quotient signal is a normalized difference signal independent of the output power and can be used as a frequency error signal in stabilizing the instantaneous frequency at the predetermined frequency.

In the frequency stabilizing device being illustrated, the frequency of the laser beam is stabilized by controlling the temperature of the laser diode 11. The output power of the laser diode 11 is stabilized by controlling the bias current supplied to the laser diode 11.

A temperature control circuit 37 is supplied with the quotient signal from the divider 32. The temperature control circuit 37 may be one available on the market and is operable in the manner which will be described in connection with another embodiment of this invention. In any event, the temperature control circuit 37 serves as a frequency stabilizing circuit for giving negative feedback to the temperature of the laser diode 11 by the quotient signal to thereby stabilize the instantaneous frequency at the predetermined frequency.

A bias current control circuit 36 is supplied with the sum signal form the adder 31 to serve as a power stabilizing circuit for using the sum signal in giving negative feedback to the bias current supplied to the laser diode 11. The bias current control circuit 36 thereby stabilizes the output power at the optimum value. Like the control signal producing circuit 29 described in conjunction with FIG. 1, the power stabilizing circuit 36 comprises an operational amplifier (not shown) having a noninverting input terminal supplied with the bias current determining current and an inverting input terminal supplied with the sum signal. An output terminal of the operational amplifier is for producing an amplifier output signal for driving a booster transistor (not shown) for the laser diode 11.

In the manner described with reference to FIG. 1, a distributed feedback laser diode was used as the laser diode 11 in the laser diode module to generate a laser beam of a wavelength of about 1.55 microns. In general, the distributed feedback laser diode generates the laser beam of a lower frequency when its temperature is high. In order to stabilize the instantaneous frequency and the output power, the uniaxial crystal body 21 was made of Iceland spar with 5 cm selected as the length.

When the instantaneous frequency is higher than the predetermined frequency, the temperature control circuit 37 uses the normalized difference signal in raising the temperature of the laser diode 11 to reduce the instantaneous frequency towards the predetermined frequency. When the instantaneous frequency is lower than the predetermined frequency, the normalized difference signal is used to make the temperature become lower to thereby raise the instantaneous frequency towards the predetermined frequency. It was possible to stabilize the instantaneous frequency within a controlled frequency range which was the predetermined frequency plus and minus 30 MHz.

When the output power is greater than the optimum value, the bias current control circuit 36 uses the sum signal in reducing the bias current to thereby reduce the output power towards the optimum value. When the output power is smaller than the optimum value, the sum signal is used to raise the bias current to thereby raise the output power towards the optimum value. It was possible to stabilize the output power within a controlled power range which was the optimum value plus and minus one percent of the optimum value.

In FIG. 3, the temperature control circuit 37 serves as a frequency control signal producing unit supplied with the quotient signal or the normalized difference signal from the divider 32 to supply a frequency control signal to the laser diode 11 in compliance with the quotient. A combination of the adder 31, the divider 32, and the frequency control signal producing unit 37 serves as the frequency control signal producing arrangement mentioned in connection with FIG. 1. Depending on the circumstances, it is possible to understand that the frequency control signal producing arrangement comprises the power stabilizing circuit as an intensity control signal producing unit supplied with the sum signal from the adder 31 to supply an intensity control signal to the laser diode 11 in compliance with the sum.

Figure 4:
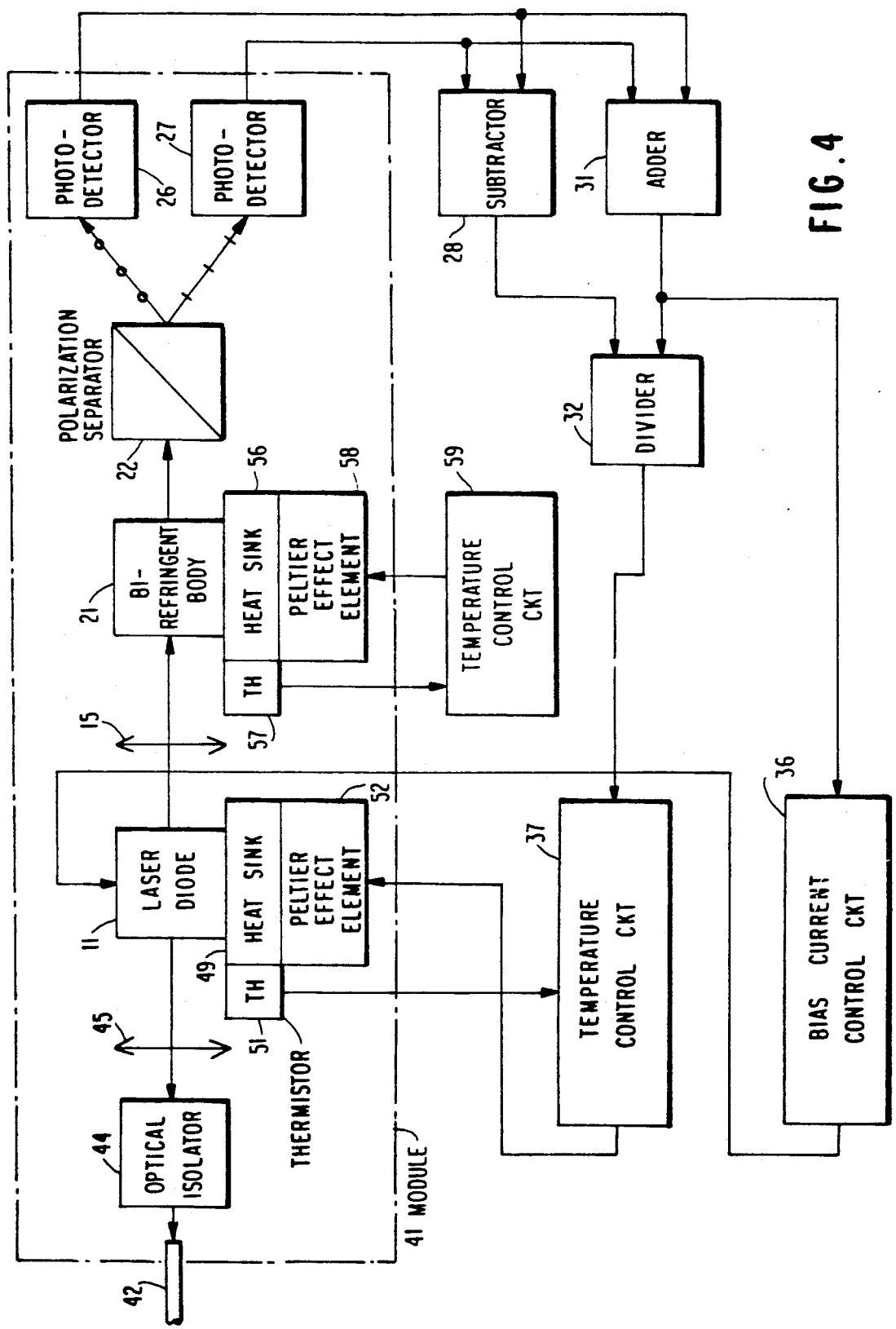
FIG. 4 is a block diagram of a laser diode module and a frequency stabilizing device which is for the laser diode module and is according to a third embodiment of this invention.

Referring now to FIG. 4, the description will proceed to a frequency stabilizing device according to a third embodiment of this invention. The frequency stabilizing device is for a laser diode module 41 which is illustrated more in detail than that described in connection with FIGS. 1 or 3. Similar parts are designated by like reference numerals and are operable with likewise named optic and electric signals.

The laser diode module 41 does not comprise the polarization adjuster 13 described in conjunction with FIGS. 1 or 3. The optical fibers 12 and 14 are not used. This is because the laser diode 11 generates the laser beam with the predetermined direction or plane of polarization described above in connection with the active layer. The birefringent body 21, the polarization separator 22, and the first and the second optical detectors 26 and 27 are included in the laser diode module 41 which may have dimensions of $73 \times 40 \times 33$ mm.

For use in an optical communication system or in a like device, an optical fiber 42 is used in leading outwardly of the laser diode module 41 one of two laser beams that is emitted from the laser diode 11 in a direction opposite to that directed to the lens 15. This one of the laser beams is supplied to the optical fiber 42 from an optical isolator 44 and is delivered to the optical isolator 44 through a lens system 45.

In the laser diode module 41, the laser diode 11 is mounted on a laser diode heat sink 49 as usual. In the manner known in the art, a first thermistor 51 is attached to the heat sink 49 to detect the temperature of the heat sink 49 and thereby that of the laser diode 11 to produce a first temperature signal representative of the temperature of the laser diode 11. The heat sink 49 is mounted, in turn, on a Peltier effect element 52 for the laser diode 11. The Peltier effect element 52 is supplied with a first temperature control signal which will shortly be described.

It may be mentioned here that the predetermined frequency is subjected in the frequency stabilizing device being illustrated to a variation which depends on a temperature coefficient of the difference between the indices of refraction of the birefringent body 21. Consequently, the birefringent body 21 is mounted on a body heat sink 56 accompanied by a second thermistor 57 for producing a second temperature signal representative of the temperature of the birefringent body 21. The body heat sink 56 is mounted on a Peltier effect element 58 for the birefringent body 21. Like the Peltier effect body 52 for the laser diode 11, the Peltier effect body 58 is supplied with a second temperature control signal which will soon be described.

Like in FIG. 3, the normalized difference signal is delivered from the divider 32 to the temperature control circuit 37 which is supplied with the first temperature signal from the first thermistor 51. The normalized difference signal is used to control the first temperature control signal in cooperation with the first temperature signal. It should be understood in connection with FIG. 3 that the temperature of the laser diode 11 is controlled in this manner.

The sum signal is delivered from the adder 31 to the bias current control circuit 36 for the laser diode 11 to stabilize the output power at the optimum value. In addition to the bias current control circuit 36 and the temperature control circuit 37, a body temperature control circuit 59 is used to receive the second temperature signal from the second thermistor 57 to supply the second temperature control signal to the Peltier effect element 58 for the birefringent body 21. This makes is possible to select the predetermined frequency for the instantaneous frequency without influenced by the temperature of the birefringent body 21.

Reviewing FIGS. 1 through 4, it should be noted that the substantially collimated beam is reflected as a reflected beam at the input end surface of the birefringent body 21 to adversely affect the laser oscillation at the laser diode 11. It is therefore preferred that the input end surface should be covered with an antireflection coating known in general. In addition, the input end surface is more preferably inclined to form an angle of about 3° with a plane which is perpendicular to the optical path of the substantially collimated beam.

As compared with a conventional frequency stabilizing device comprising a Febry-Perot resonator, an astonishing improvement is achieved by this manner of avoiding the reflected beam from returning to the laser diode 11. No optical isolator is necessary between the laser diode 11 and the birefringent body 21. When used with an inclined input end surface, the Fabry-Perot resonator is given a degraded finesse. The instantaneous frequency can not be well discriminated. In marked contrast, the birefringent body 21 has an excellent frequency discriminating ability even when the input end surface is inclined in the manner exemplified in the foregoing.

It should furthermore be noted in connection with this invention that the frequency stabilizing device has an appreciable tolerance as regards a deviation in angle of the optical path of the substantially collimated beam. Moreover, the substantially collimated beam may be a little convergent or divergent beam or rays which form an angle of up to 10° with one another on a plane including the optical path.

It is known in physics that an optically isotropic substance shows an optical anisotropy under certain circumstances. A typical example is a Kerr cell. It is possible to manufacture the birefringent body 21 by using such a substance. Either such a body 21 or the uniaxial crystal body 21 will be referred to herein as a uniaxial body.

It is known in addition that a lambda plate can be made of a biaxial crystal which is typically muscovite and has two optic axes forming an optic axis angle. When muscovite is used, the lambda plate has input and output end surfaces parallel to a line which bisects the optic axis angle. The birefringent body 21 can be made of such a biaxial crystal. This kind of a body 21 is herein called either a biaxial body or a biaxial crystal body.

When a biaxial crystal body 21 is used, attention should be directed to the line which bisects the optic axis angle as a bisecting line. This biaxial crystal body 21 should be oriented so that the bisecting line may form an angle of 45° with the predetermined plane of polarization of the substantially collimated beam. When defined by the orthogonal directions of polarization, the polarization separating element 22 should be oriented in the manner described before.

While this invention has thus far been described in specific conjunction with three preferred embodiments thereof and several modifications, it will now be readily possible for one skilled in the art to carry this invention into effect in various other manners. For example, it is possible to use a circularly polarized beam as the substantially collimated beam by making the laser beam pass through a half-wave plate before incident on the input end surface of the birefringent body 21. When the laser diode 11 is a distributed Bragg reflector laser diode (DBR LD) which is a wavelength tunable laser diode, the instantaneous frequency can be stabilized by controlling an injection current supplied to its phase control region and to its distributed Braff reflector region. The output power can be controlled by controlling an injection current supplied to its active region. Incidentally, the distributed Braff reflector laser diode is described in a letter contributed by Murata el al to the Electronics Letters, Volume 24 (1988), page 577, under the title of "Tuning Ranges for 1.5μ Wavelength Tunable DBR Lasers". Incidentally, it should be noted that the laser diode module 41 is somewhat difference from that described with reference to FIG. 1. The laser diode module 41 can be put on the market without the laser diode 11, which a user can readily and correctly place in the module 41.

What is claimed is:

1. A frequency stabilizing device for a laser diode module which generates a polarized laser beam having a frequency variation, said frequency stabilizing device supplying a frequency control signal to said laser diode module to stabilize said laser diode module in frequency, said frequency stabilizing device comprising:

a birefringent body, disposed outside said laser diode module and supplied with said polarized laser beam, for converting said frequency variation to a variation in a polarization state of said polarized laser beam to produce a polarization varied beam;

a polarization separating element, coupled to said birefringent body, for separating said polarization varied beam into first and second beam components which are orthogonally polarized and have first and second beam intensities;

a first optical detector, coupled to said polarization separating elements and supplied with said first beam component, for detecting said first beam intensity to produce a first detection signal representative of said first beam intensity;

a second optical detector, coupled to said polarization separating elements and supplied with said second beam component, for detecting said second beam intensity to produce a second detection signal representative of said second beam intensity;

a subtracter, operatively connected to said first and second optical detectors and supplied with said first and said second detection signals, for calculating a difference between said first and said second beam intensities to produce a difference signal representative of said difference; and a control signal producing arrangement, operatively connected to said subtracter and supplied with said difference signal for producing said frequency control signal in compliance with said difference.

2. A frequency stabilizing device as claimed in claim 1, wherein said control signal producing arrangement comprises:

an adder supplied with said first and said second detection signals for calculating a sum of said first and said second beam intensities to produce a sum signal representative of said sum;

a divider supplied with said difference and said sum signals for calculating a quotient of said difference divided by said sum to produce quotient signal representative of said quotient; and a frequency control signal producing unit supplied with said quotient signal for producing said frequency control signal in compliance with said quotient.

3. A frequency stabilizing device as claimed in claim 2, said polarized laser beam being a linearly polarized laser beam generated along an optical path and having a predetermined direction of polarization, wherein:

said birefringent body is a uniaxial body and has an optic axis which forms an angle of 45° with said predetermined direction on a plane which is perpendicular to said optical path;

said polarizarion separating element being for making said first and said second beam components respectively have directions of polarization which are parallel and perpendicular to said predetermined direction.

4. A frequency stabilizing device as claimed in claim 2, said polarized laser beam being a linearly polarized laser beam generated along an optical path and having a predetermined direction of polarization, wherein:

said birefringent body is a biaxial body having two optic axes forming an optic axis angle and has a line bisecting said optic axis angle with said line bisecting the optic axis angle made to form an angle of 45° with said predetermined direction on a plane which is perpendicular to said optical path;

said polarization separating element being for making said first and second beam components respectively have directions of polarization which are parallel and perpendicular to said predetermined direction.

5. A frequency stabilizing devices as claimed in claim 2, said polarized laser beam having a beam intensity susceptible to a variation, said frequency stabilizing device being for supplying an intensity control signal to said laser diode module to stabilize said beam intensity, wherein said control signal producing arrangement further comprises an intensity control unit supplied with said sum signal for producing said intensity control signal in compliance with said sum.

6. A frequency stabilizing device as claimed in claim 5, said polarized laser beam being a linearly polarized laser beam generated along an optical path and having a predetermined direction of polarization, wherein:

said birefringent body is a uniaxial body having an optic axis which forms an angle of 45° with said predetermined direction on a plane perpendicular to said optical path;

said polarization separating element being for making said first and said second beam components respectively have directions of polarization which are parallel and perpendicular to said predetermined direction.

7. A frequency stabilizing device as claimed in claim 5, said polarized laser beam being a linearly polarized laser beam generated along an optical path and having a predetermined direction of polarization, wherein:

said birefringent body is a biaxial body having two optic axes forming an optic axis angle and has a line bisecting said optic axis angle with said line bisecting the optic axis angle made to form an angle 45° with said predetermined direction on a plane which is perpendicular to said optical path;

said polarization separating element being for making said first and said second beam components respectively have directions of polarization which are parallel and perpendicular to said predetermined direction.

8. A frequency stabilizing device as claimed in claim 1, wherein said laser beam module comprises a laser diode which produces said polarized laser beam, the polarized laser beam having a predetermined direction of polarization.

9. A frequency stabilizing device as claimed in claim 1, wherein said laser beam module comprises:

a laser diode for producing a laser beam; and polarization adjusting means, disposed outside said laser diode and supplied with said laser beam, for producing said polarized laser beam.

10. A laser diode module for generating a polarized laser beam with a laser diode placed therein, said polarized laser beam having a predetermined direction of polarization and having a frequency variation, said laser diode module comprising:

a birefringent body, disposed outside the laser diode and supplied with said polarization adjusted beam, for converting said frequency variation to a variation in a polarization state of said polarized laser beam to produce a polarization varied beam;

a polarization separating element, coupled to said birefringent body, for separating said polarization varied beam into first and second beam components which are orthogonally polarized and have first and second beam intensities;

a first optical detector, coupled to said polarization separating element and supplied with said first beam component, for detecting said first beam intensity to produce a first detection signal representative of said first beam intensity; and a second optical detector, coupled to said polarization separation element and supplied with said second beam component, for detecting said second beam intensity to produce a second detection signal representative of said second beam intensity.

11. A laser diode module as claimed in claim 10, said polarized laser beam being a linearly polarized laser beam generated along an optical path and having a predetermined direction of polarization, wherein:

said birefringent body is a uniaxial crystal body and has an optic axis which forms an angle of 45° with said predetermined direction on a plane which is perpendicular to said optical path;

said polarization separating element being for making said first and said beam components respectively have directions of polarization which are parallel and perpendicular to said predetermined direction.

12. A laser diode module as claimed in claim 10, said polarized laser beam being a linearly polarized laser beam generated along an optical path and having a predetermined direction of polarization, wherein:

said birefringent body is a biaxial crystal body having two optic axes forming an optic axis angle and has a line bisecting said optic axis angle with said line bisecting the optic axis angle made to form an angle 45° with said predetermined direction on a plane which is perpendicular to said optical path;

said polarization separating element being for making said first and said second beam components respectively have directions of polarization which are parallel and perpendicular to said predetermined direction.

* * * * *